United States Patent
Yosui

(10) Patent No.: US 10,237,978 B2
(45) Date of Patent: Mar. 19, 2019

(54) COMPONENT BUILT-IN MULTILAYER SUBSTRATE FABRICATING METHOD

(71) Applicant: Murata Manufacturing Co., Ltd., Kyoto (JP)

(72) Inventor: Kuniaki Yosui, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 65 days.

(21) Appl. No.: 14/856,895

(22) Filed: Sep. 17, 2015

(65) Prior Publication Data

US 2016/0007480 A1 Jan. 7, 2016

Related U.S. Application Data

(63) Continuation of application No. PCT/JP2014/062772, filed on May 14, 2014.

(30) Foreign Application Priority Data

May 17, 2013 (JP) ................................. 2013-104813

(51) Int. Cl.
   *H05K 1/18* (2006.01)
   *H05K 3/46* (2006.01)
   (Continued)

(52) U.S. Cl.
   CPC .............. *H05K 1/186* (2013.01); *H01Q 1/12* (2013.01); *H01Q 1/2208* (2013.01);
   (Continued)

(58) Field of Classification Search
   CPC ..... H05K 1/186; H05K 3/4632; H05K 3/4617
   See application file for complete search history.

(56) References Cited

U.S. PATENT DOCUMENTS

| | | |
|---|---|---|
| 2002/0192442 A1 | 12/2002 | Kondo |
| 2007/0095471 A1 | 5/2007 | Ito |
| | (Continued) | |

FOREIGN PATENT DOCUMENTS

| | | |
|---|---|---|
| CN | 101370360 A | 2/2009 |
| JP | 2003-086949 A | 3/2003 |
| | (Continued) | |

OTHER PUBLICATIONS

Written Opinion issued in International Application No. PCT/JP2014/062772 dated Aug. 19, 2014.
International Search Report issued in Application No. PCT/JP2014/062772 dated Aug. 19, 2014.

*Primary Examiner* — Livius Radu Cazan
(74) *Attorney, Agent, or Firm* — Pearne & Gordon LLP

(57) ABSTRACT

A fabricating method according to the present disclosure is a component built-in multilayer substrate fabricating method for incorporating a component (12) in a resin multilayer substrate (11) formed by laminating and pressing thermoplastic resin sheets (111a to 111d) so as to crimp them to each other. With the fabricating method according to the present disclosure, a metal pattern (13) is provided on a component mounting surface of the thermoplastic resin sheet (111a). Further, the component (12) is inserted in the area sandwiched by the metal pattern (13). Out of widths relating to the area sandwiched by the metal pattern (13), the width in the component mounting surface side is assumed to be a width $W_2$, and the width in the component-insertion side is assumed to be a width $W_3$, the width $W_2$ being equal to or larger than a width $W_1$ of the component but less than the width $W_3$.

6 Claims, 10 Drawing Sheets

(51) Int. Cl.
*H01Q 1/22* (2006.01)
*H01Q 1/12* (2006.01)
*H05K 3/30* (2006.01)
*H05K 1/16* (2006.01)

(52) U.S. Cl.
CPC ............. *H01Q 1/2283* (2013.01); *H05K 3/30*
(2013.01); *H05K 3/4617* (2013.01); ***H05K
3/4632*** (2013.01); *H01L 2224/16225*
(2013.01); *H01L 2924/15311* (2013.01); *H05K
1/165* (2013.01); *H05K 2201/0129* (2013.01);
*H05K 2201/0141* (2013.01); *H05K 2201/0355*
(2013.01); *H05K 2201/086* (2013.01); *H05K
2201/098* (2013.01); *H05K 2201/09781*
(2013.01); *H05K 2201/09827* (2013.01); *H05K
2201/10098* (2013.01); *H05K 2203/0278*
(2013.01); *H05K 2203/063* (2013.01); *H05K
2203/167* (2013.01)

(56) References Cited

U.S. PATENT DOCUMENTS

| | | |
|---|---|---|
| 2010/0027225 A1 | 2/2010 | Yuda |
| 2012/0287586 A1 | 11/2012 | Mikado |
| 2014/0003011 A1* | 1/2014 | Kato .................... H01L 23/5389 |
| | | 361/762 |
| 2014/0029222 A1* | 1/2014 | Saito ...................... H05K 1/186 |
| | | 361/762 |

FOREIGN PATENT DOCUMENTS

| | | | |
|---|---|---|---|
| JP | 2008-270778 A | 11/2008 | |
| JP | WO 2012120995 A1 * | 9/2012 | ......... H01L 23/5389 |
| JP | WO 2012137548 A1 * | 10/2012 | ............ H05K 1/186 |
| WO | WO 2004077545 A1 * | 9/2004 | ............ H01L 24/81 |
| WO | 2007/043714 A1 | 4/2007 | |
| WO | 2008/136251 A1 | 11/2008 | |
| WO | 2012/157426 A1 | 11/2012 | |

* cited by examiner

COMPONENT BUILT-IN MULTILAYER SUBSTRATE FABRICATING METHOD

BACKGROUND OF THE INVENTION

1. Field of the Invention

The present disclosure relates to a method for fabricating component built-in multilayer substrates including resin multilayer substrates and components incorporated therein, and relates to such component built-in multilayer substrates.

2. Description of the Related Art

Component built-in multilayer substrates have been employed in radio communication devices having short-distance radio communication functions, and the like. For example, JP-A No. 2003-86949 describes a method for fabricating such a component built-in multilayer substrate.

In the fabricating method described in JP-A No. 2003-86949, at first, opening portions are formed in thermoplastic resin sheets. Next, the thermoplastic resin sheets are laminated, such that a component is placed in the cavity formed by the opening portions having been connected to each other. Next, the thermoplastic resin sheets are crimped to each other and the component is housed in the cavity, through thermal pressing. Thus, a component built-in multilayer substrate incorporating the component is formed.

SUMMARY OF THE INVENTION

When the thermoplastic resin sheets are laminated, the positions of the thermoplastic resin sheets may be deviated. Namely, deviations in the lamination thereof may be induced. In this case, the size of the cavity is made smaller than in a case where no deviation in the lamination is induced. Further, when the cavity has a size substantially equal to the size of the component, it is hard to stably insert the component therein. Therefore, in order to enable inserting the component in the cavity even in such cases, it is necessary to preliminarily set the size of the cavity to be larger.

On the other hand, in the fabricating method in JP-A No. 2003-86949, the position at which the component is placed is defined by the shape of the cavity. Therefore, in the case where the cavity has a larger size, it is impossible to define the position at which the component is placed with excellent accuracy. In this case, the component may move within the cavity, which may induce problems in the electrical connection between the component and via hole conductors, pad conductors or the like, which are placed within the resin multilayer substrate.

It is an object of the present disclosure to provide a method for fabricating a component built-in multilayer substrate which enables placing a component within a resin multilayer substrate with excellent accuracy.

(1) A fabricating method according to the present disclosure is a component built-in multilayer substrate fabricating method for incorporating a component in a resin multilayer substrate formed by laminating and pressing thermoplastic resin sheets so as to crimp them to each other. With the fabricating method according to the present disclosure, a guide pattern is provided on a component mounting surface of a first thermoplastic resin sheet, which constitutes the thermoplastic resin sheets. Further, the component is inserted in the area sandwiched by the guide pattern. Out of widths relating to the area sandwiched by the guide pattern, the width in the component mounting surface side is assumed to be a width $W_2$, and the width in the component-insertion side is assumed to be a width $W_3$, the width $W_2$ being equal to or larger than a width $W_1$ of the component but less than the width $W_3$.

Through this processing, the position at which the component is placed is defined by the guide pattern and, therefore, the component is less prone to be deviated from a predetermined position as the width $W_2$ is made closer to the width $W_1$. On the other hand, in setting the width $W_2$, there is no need for considering deviations of the lamination of the thermoplastic resin sheets. Further, since the width $W_3$ is larger than the width $W_2$, it is not hard to insert the component in the area sandwiched by the guide pattern, even when the width $W_2$ is made closer to the width $W_1$. This enables setting the width $W_2$ to be a value closer to the width $W_1$. As a result thereof, the component is inhibited from being deviated from the predetermined position, which enables placing the component within the resin multilayer substrate with excellent accuracy.

(2) The fabricating method according to the present disclosure may have characteristics as follows. In the fabricating method according to the present disclosure, a second thermoplastic resin sheet constituting the thermoplastic resin sheets is brought into contact with the component mounting surface. The second thermoplastic resin sheet is provided with an opening portion formed in its main surface. The component is positioned in the opening portion when viewed in a direction normal to the component mounting surface. The opening portion has a width $W_4$ which is equal to or larger than the width $W_3$.

With this processing, it is possible to insert the component in the opening portion, even if a deviation in the lamination of the thermoplastic resin sheets is induced.

(3) In the fabricating method according to the present disclosure, assuming that the component has a largest width of a width $W_5$ when the component is inclined with respect to the component mounting surface, it is preferable that the width $W_2$ is equal to or less than the width $W_5$.

With this method, it is possible to place the component within the resin multilayer substrate with higher accuracy.

(4) In the fabricating method according to the present disclosure, the guide pattern may be constituted by a metal pattern.

(5) A component built-in multilayer substrate according to the present disclosure includes a resin multilayer substrate, a component and a guide pattern. The resin multilayer substrate is formed from thermoplastic resin sheets being laminated. The component is incorporated in the resin multilayer substrate. The guide pattern is formed on a component mounting surface inside the resin multilayer substrate. The component is placed on an area of the component mounting surface which is sandwiched by the guide pattern. Out of side surfaces of the guide pattern, the side surface closer to the component is tapered in such a way as to be gradually narrowed toward the component mounting surface.

With this structure, similarly, the position at which the component is placed is defined by the guide pattern having the tapered side surface, which enables placing the component within the resin multilayer substrate with excellent accuracy.

(6) In the component built-in multilayer substrate according to the present disclosure, the guide pattern may be constituted by a metal pattern.

According to the present disclosure, the guide pattern having the tapered side surface is formed on a thermoplastic resin sheet, which enables placing the component within the resin multilayer substrate with excellent accuracy.

DETAILED DESCRIPTION OF THE INVENTION

First Embodiment

There will be described a method for fabricating a component built-in multilayer substrate according to a first embodiment of the present disclosure. FIGS. 1A to 1D are cross-sectional views illustrating the method for fabricating the component built-in multilayer substrate according to the first embodiment. FIG. 2 is a plan view illustrating a metal pattern 13 according to the first embodiment.

Figure 1A:
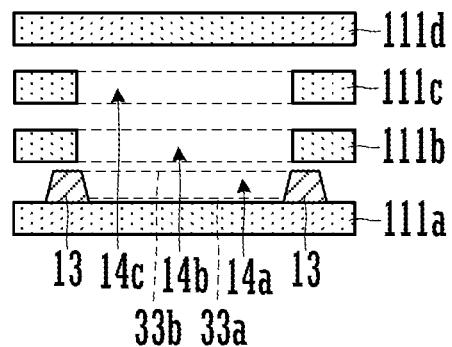
FIG. 1A to 1D are cross-sectional views illustrating a method for fabricating a component built-in multilayer substrate according to a first embodiment.
Figure 2:
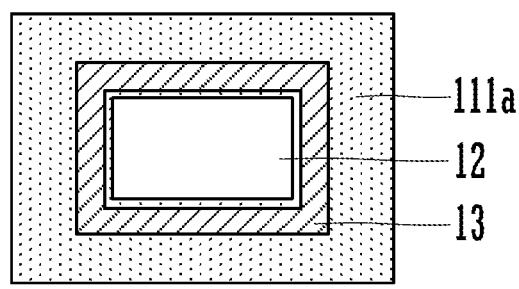
FIG. 2 is a plan view illustrating a metal pattern according to the first embodiment.

At first, as illustrated in FIG. 1A, thermoplastic resin sheets 111a to 111d are prepared. The thermoplastic resin sheets can be formed from a liquid crystal polymer, for example. Further, the metal pattern 13 made of a copper foil is formed on the thermoplastic resin sheet 111a. At this time, as illustrated in FIG. 2, the metal pattern 13 is formed to have a frame shape surrounding a portion in which a component 12 is desired to be placed. Further, the metal pattern 13 may be also formed from a dummy wiring, a planar-shaped conductor, or the like, which is not used in the circuit; and also may be formed from a wiring, a planar-shaped conductor, or the like, which is actually used in the circuit.

The thermoplastic resin sheet 111a corresponds to a first thermoplastic resin sheet according to the present disclosure. The thermoplastic resin sheets 111b and 111c correspond to a second thermoplastic resin sheet according to the present disclosure. The metal pattern 13 corresponds to a guide pattern according to the present disclosure.

Hereinafter, out of the surfaces of the metal pattern 13, the surface which comes in contact with the thermoplastic resin sheet 111a is referred to as a lower surface, the surface opposite from the lower surface is referred to as an upper surface, and the surfaces connecting the upper surface and the lower surface to each other are referred to as side surfaces. Further, out of the main surfaces of the thermoplastic resin sheet 111a, the main surface on which the metal pattern 13 (namely the guide pattern) is formed is referred to as a component mounting surface.

The metal pattern 13 has an opening portion 14a penetrating therethrough from its upper surface to the lower surface. The opening portion 14a has opening surfaces 33a and 33b having respective rectangular shapes. The opening surface 33a is positioned in the lower surface side of the metal pattern 13. The opening surface 33b is positioned in the upper surface side of the metal pattern 13. The opening portion 14a has a side surface which is tapered from the opening surface 33b toward the opening surface 33a, and the opening surface 33b is larger than the opening surface 33a. The opening portion 14a corresponds to "an area sandwiched by the guide pattern".

Further, an opening portion 14b having a rectangular-shaped opening surface is formed in the thermoplastic resin sheet 111b, through laser processing, punching, die cutting or the like. The opening portion 14b penetrates through the thermoplastic resin sheet 111b, in the direction normal to the main surface of the thermoplastic resin sheet 111b. Similarly, an opening portion 14c is formed in the thermoplastic resin sheet 111c. The opening surface of the opening portion 14b and the opening surface of the opening portion 14c have the same size.

Figure 1B:
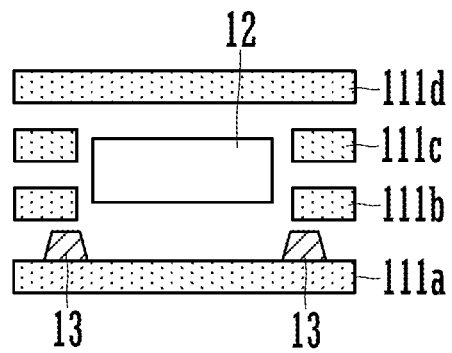
Figure 1C:
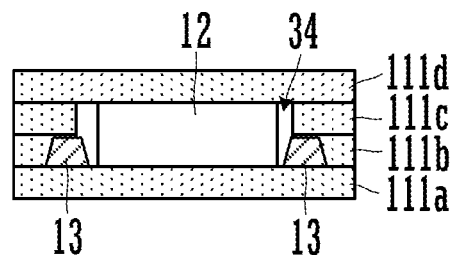

Next, as illustrated in FIGS. 1B and 1C, a component 12 having a substantially rectangular flat-plate shape is inserted into the opening portion 14a. Further, the thermoplastic resin sheets 111b to 111d are laminated in the mentioned order on the thermoplastic resin sheet 111a, such that the component 12 is positioned in the opening portions 14b and 14c. At this time, the opening portions 14b and 14c are connected to each other, thereby forming a cavity 34. Further, the component 12 is placed in the cavity 34. Namely, the component 12 is placed inside the resin layers formed from the thermoplastic resin sheets 111b to 111d.

Also, the thermoplastic resin sheets 111a to 111 c may be laminated on the thermoplastic resin sheet 111d on which the component 12 has been placed, in order to form the same structure. Also, the thermoplastic resin sheets 111a to 111 c may be laminated and temporarily crimped to each other, further, the component 12 may be placed in the cavity 34 and, thereafter, the thermoplastic resin sheet 111d may be laminated thereon.

Figure 3:
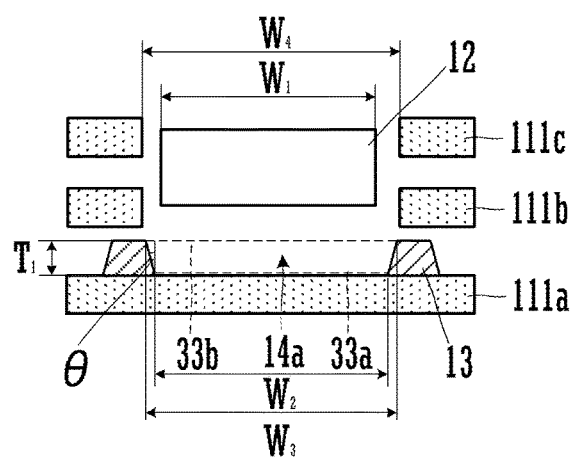
FIG. 3 is a cross-sectional view illustrating sizes relating to the component built-in multilayer substrate.

FIG. 3 is a cross-sectional view illustrating sizes relating to the component built-in multilayer substrate. Further, the sizes represented in FIG. 3 are realized in a plane parallel to a side surface of the component 12, but are not limited thereto, and are realized in at least one of cross sections normal to the component mounting surface.

The opening surface 33a has a width $W_2$ which is equal to or larger than the width $W_1$ of the component 12 but less than the width $W_3$ of the opening surface 33b. Further, the opening portions 14b and 14c (see FIGS. 1A to 1D) have a width $W_4$ which is equal to or larger than the width $W_3$ of the opening surface.

In order to bring the main surface of the component 12 into contact with the component mounting surface sandwiched by the metal pattern 13, the width $W_2$ of the opening surface 33a is made equal to or larger than the width $W_1$ of the component 12. Further, in order to make it easier to insert the component 12 into the opening portion 14a, the side surface of the opening portion 14a is tapered, and the width $W_3$ of the opening surface 33b is made larger than the width $W_2$ of the opening surface 33a.

As described above, in laminating the thermoplastic resin sheets 111a to 111d, the positions of the thermoplastic resin sheets 111a to 111d may be deviated. Namely, deviations in the lamination thereof may be induced. In this case, the width of the cavity 34 (see FIGS. 1A to 1D) is made smaller than the width $W_4$ of the opening portions 14b and 14c. On the other hand, in order to make it easier to place the component 12 in the cavity 34, it is necessary to make the width of the cavity 34 generally equal to the width $W_3$ of the opening surface 33b. Therefore, the width $W_4$ of the opening portions 14b and 14c is set to be equal to or larger than the width $W_3$ of the opening surface 33b.

The metal pattern 13 has a height (thickness) $T_1$ of 10 to 40 μm. The angle θ formed between the direction normal to the component mounting surface and the side surface of the opening portion 14a can be about 0 to 45 degrees. By making the angle θ larger, the width $W_3$ of the opening surface 33b is made larger, which makes it easier to insert the component 12 into the opening portion 14a. On the other hand, by making the angle θ smaller, the side surfaces of the metal pattern 13 come closer to being normal to the component mounting surface.

Figure 4:
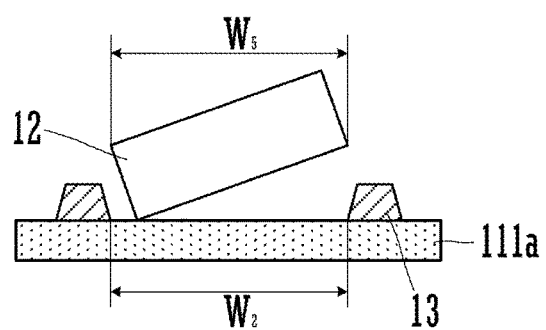
FIG. 4 is a cross-sectional view illustrating sizes relating to the component built-in multilayer substrate.

Further, as illustrated in FIG. 4, the width $W_2$ of the opening surface 33a is equal to or less than the largest width $W_5$ of the component 12. In this case, the length of the component 12 which is measured in the direction parallel to the component mounting surface is varied by inclining the component 12 with respect to the component mounting surface, and the largest length, out of these lengths, is assumed to be the largest width $W_5$ of the component 12.

Even when the width $W_2$ of the opening surface 33a is made equal to or less than the largest width $W_5$ of the component 12, by tapering the side surface of the opening portion 14a, it is possible to insert the component 12 in the opening portion 14a. Namely, in inserting the component 12 in the opening portion 14a, even if the component 12 is inclined with respect to the component mounting surface, the component 12 is prevented from being hitched to the metal pattern 13 at its corner portions.

Figure 1D:
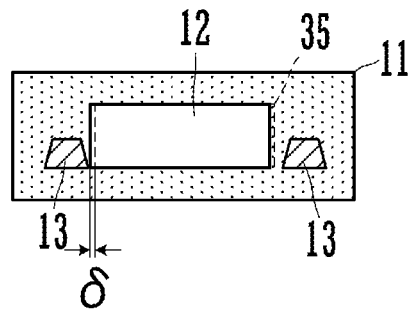

Next, as illustrated in FIG. 1D, the thermoplastic resin sheets 111a to 111d are thermally crimped to each other (thermally pressed to each other). Thus, the thermoplastic resin sheets 111a to 111d are bonded to each other to be integrated, thereby forming a resin multilayer substrate 11. At this time, the resins forming the thermoplastic resin sheets 111a to 111d are softened and flowed, thereby filling the gap between the side surface of the cavity 34 and the side surface of the component 12 with the resins.

Through the aforementioned processes, the fabrication of the component built-in multilayer substrate incorporating the component 12 has been completed.

FIGS. 5A to 5D are cross-sectional views illustrating a method for fabricating a component built-in multilayer substrate as a comparative example. At first, thermoplastic resin sheets 111a to 111d are laminated, such that a component 12 is placed in a cavity 34 formed by opening portions 14b and 14c which are connected to each other. Further, the thermoplastic resin sheets 111a to 111d are thermally crimped to each other, thereby completing the fabrication of the component built-in multilayer substrate incorporating the component 12. Namely, the fabricating method according to the comparative example is the same as the fabricating method according to the first embodiment, except that the metal pattern 13 (see FIGS. 1A to 1D) is not formed therein.

With the fabricating method according to the first embodiment, the component 12 is placed in the area sandwiched by the metal pattern 13. Therefore, as illustrated in FIG. 1D, when the component 12 comes in contact at its corner portion with the metal pattern 13, the position of the component 12 is deviated most from a predetermined position 35 (the position at which the component 12 is desired to be placed). Namely, the position of the component 12 is deviated from the predetermined position 35 by about $\delta=(W_2-W_1)/2$ at the maximum.

Figure 5A:
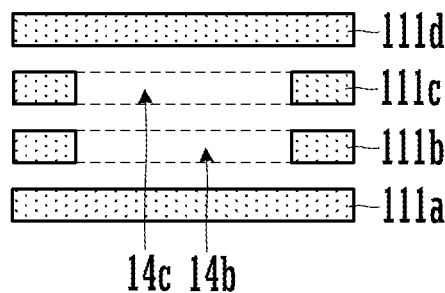
FIGS. 5A to 5D are cross-sectional views illustrating a method for fabricating a component built-in multilayer substrate as an comparative example.
Figure 5B:
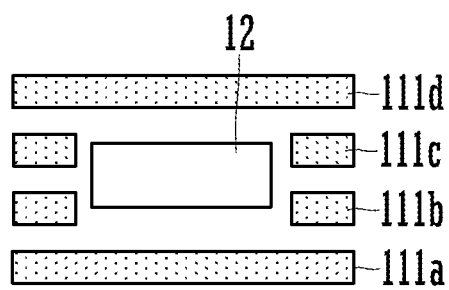
Figure 5C:
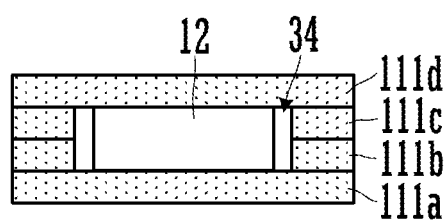
Figure 5D:
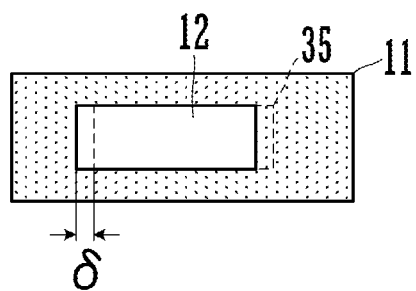

On the other hand, with the fabricating method in the comparative example, the metal pattern 13 is not formed. Therefore, as illustrated in FIGS. 5C and 5D, if the side surface of the component 12 comes into contact with the side surface of the cavity 34, the position of the component 12 is deviated most from the predetermined position 35. Namely, the position of the component 12 is deviated from the predetermined position 35 by about $\delta=(W_4-W_1)/2$, at the maximum.

As described above, in setting the width $W_2$ of the opening portion 14a, there is no constraint imposed thereon, except that the width $W_2$ of the opening portion 14a should be equal to or larger than the width $W_1$ of the component 12. On the other hand, in setting the width $W_4$ of the opening portions 14b and 14c, it may be important to consider the deviations of the lamination of the thermoplastic resin sheets 111a to 111d, in addition to the constraint imposed on the width $W_2$ of the opening portion 14a. Therefore, the width $W_4$ of the opening portions 14b and 14c be made larger than the width $W_2$ of the opening portion 14a.

As a result thereof, in the first embodiment, it is possible to inhibit the position of the component 12 from being deviated from the predetermined position 35, in comparison with the comparative example. Namely, in the first embodiment, it is possible to place the component 12 at the predetermined position 35 more accurately than in the comparative example.

Further, when viewed in the direction normal to the component mounting surface, the metal pattern 13 surrounds the component 12, which can electromagnetically isolate the component 12 from the outside, due to its shielding effect.

Figure 6:
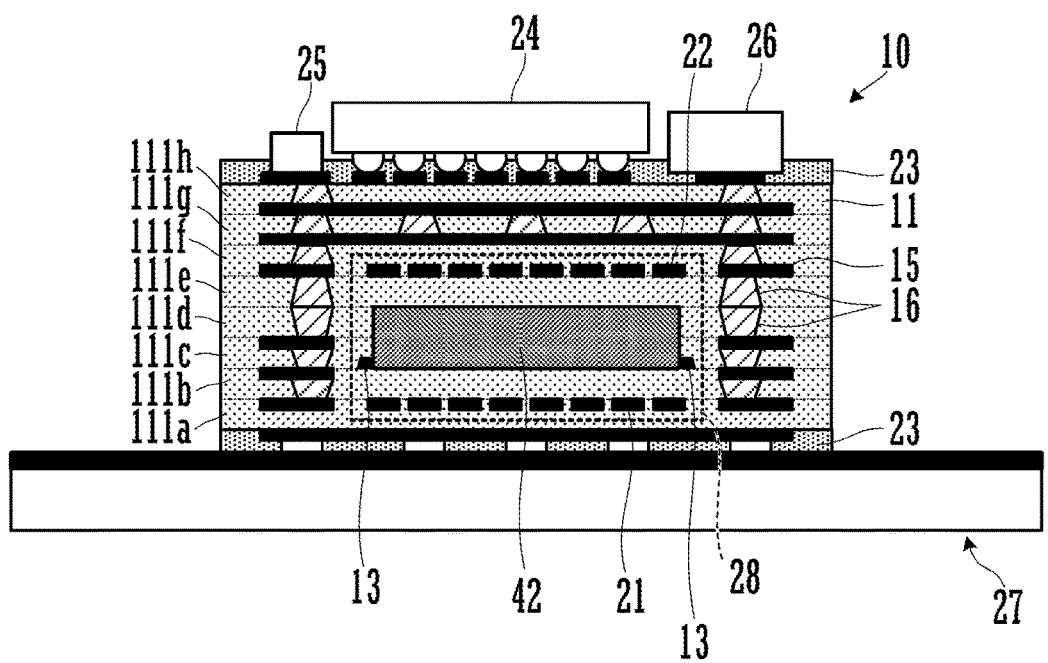
FIG. 6 is a cross-sectional view of a main portion of an antenna module incorporating a ferrite core.

Next, there will be described an antenna module which is fabricated through the method for fabricating a component built-in multilayer substrate according to the first embodiment. FIG. 6 is a cross-sectional view of a main portion of an antenna module 10 incorporating a ferrite core.

A plurality of thermoplastic resin sheets 111a to 111 h are laminated to form a resin multilayer substrate 11. A ferrite core 42 is embedded in the resin multilayer substrate 11. The ferrite core 42 is placed in the area sandwiched by a metal pattern 13. The ferrite core 42 corresponds to the component 12. Further, in the resin multilayer substrate 11, coil conductors constituted by stripe-shaped portions 21 and 22 and the like are formed in such a way as to be wound around the ferrite core 42.

Further, in the resin multilayer substrate 11, there are formed wirings and circuits constituted by conductor patterns 15 and via conductors 16. On the upper surface of the resin multilayer substrate 11, there are formed a conductor pattern and a solder resist 23, and mounted components 24, 25 and 26 are mounted thereon. On the lower surface (the mounting surface) of the resin multilayer substrate 11, there are formed terminal electrodes and a solder resist 23.

The aforementioned mounted components 24, 25 and 26 can be, for example, any of a radio frequency integrated circuit (RFIC), a chip capacitor, a chip inductor and the like. The antenna module 10 is used as a short-distance radio communication module for NFC and the like, for example. The antenna module 10 can be incorporated in a mount substrate 27 in a unit in which it is incorporated, thereby forming a radio communication device having a short-distance radio communication function.

With the antenna module 10, it is possible to inhibit the position of the ferrite core 42 from being deviated from the predetermined position, thereby stabilizing the antenna characteristics of the antenna module 10.

Second Embodiment

Figure 7A:
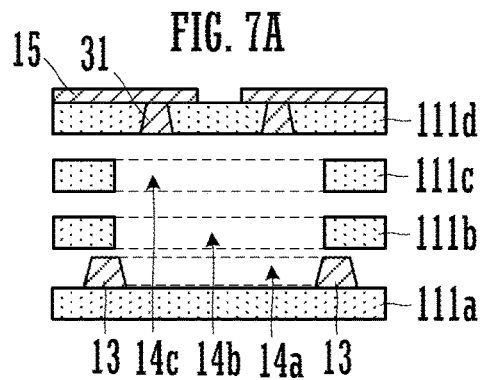
FIGS. 7A to 7D are cross-sectional views illustrating a method for fabricating a component built-in multilayer substrate according to a second embodiment.

There will be described a method for fabricating a component built-in multilayer substrate according to a second embodiment of the present disclosure. FIGS. 7A to 7D are cross-sectional views illustrating the method for fabricating a component built-in multilayer substrate according to the second embodiment. At first, as illustrated in FIG. 7A, thermoplastic resin sheets 111a to 111d are prepared. A conductor pattern 15 is formed on the thermoplastic resin sheet 111d. Holes for via conductors are formed in the thermoplastic resin sheet 111d, and these holes are filled with a conductive paste 31.

Figure 7B:
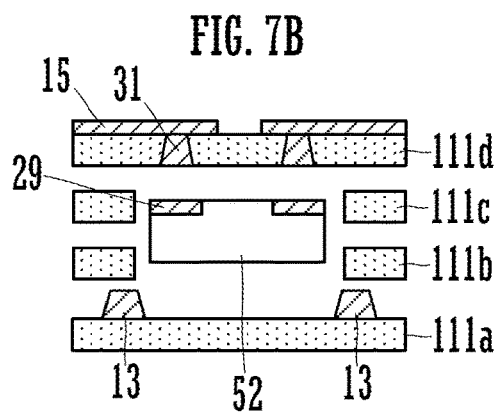
Figure 7C:
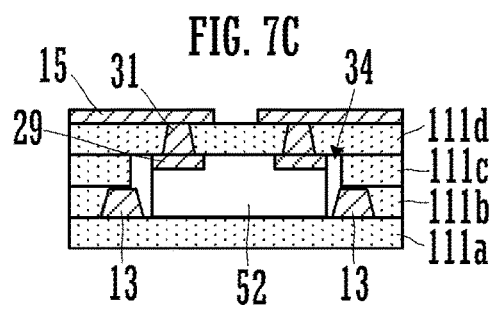

Next, as illustrated in FIGS. 7B and 7C, an RFIC chip 52 having a substantially rectangular flat-plate shape is prepared. Terminal electrodes 29 are formed on a first main surface of the RFIC chip 52. Next, the RFIC chip 52 is inserted into an opening portion 14a, such that a second main surface (opposite from the first main surface) of the RFIC chip 52 comes in contact with the component mounting surface. Further, the thermoplastic resin sheets 111b to 111d are laminated in the mentioned order on the thermoplastic resin sheet 111a. Thus, the RFIC chip 52 is placed in the cavity 34. Further, the terminal electrode 29 comes into contact with the conductive paste 31.

Figure 7D:
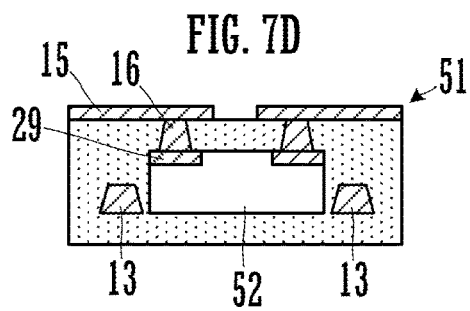

Next, as illustrated in FIG. 7D, the thermoplastic resin sheets 111a to 111d are thermally crimped to each other. Thus, the thermoplastic resin sheets 111a to 111d are bonded to each other to be integrated, thereby forming a resin multilayer substrate 51. At this time, the conductive paste 31 filled in the holes for the via conductors is metalized (sintered) and cured, thereby forming via conductors 16. Further, the conductor pattern 15 and the terminal electrodes 29 are electrically connected to each other through the via conductors 16.

Through the aforementioned processes, the fabrication of the component built-in multilayer substrate incorporating the RFIC chip 52 has been completed. Further, the other points of the second embodiment are the same as those of the first embodiment.

In the second embodiment, the RFIC chip 52 is placed in the area sandwiched by the metal pattern 13, as in the first embodiment. Therefore, the position of the RFIC chip 52 is inhibited from being deviated from the predetermined position. This can suppress contact failure between the terminal electrodes 29 and the via conductors 16.

Figure 8:
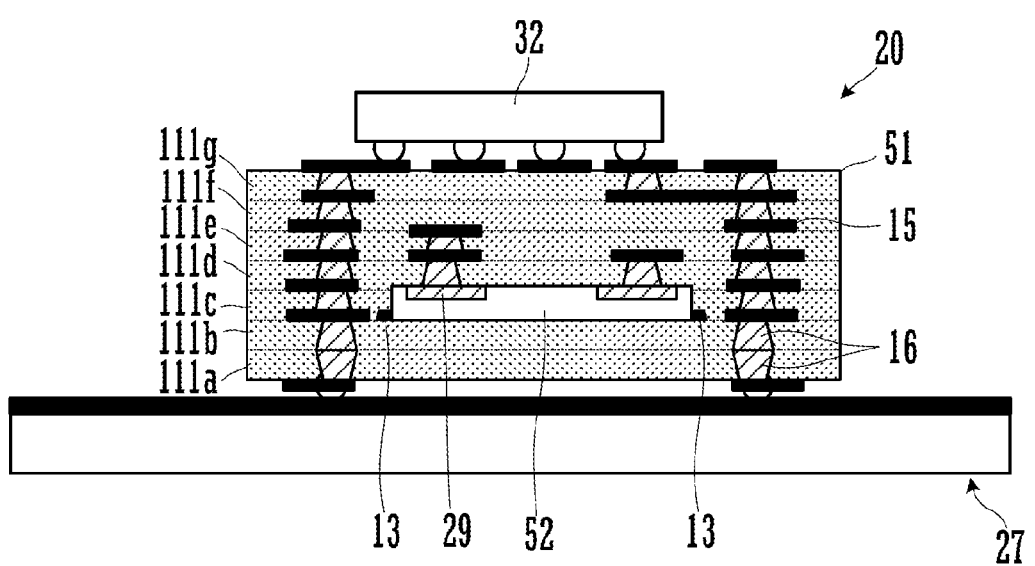
FIG. 8 is a cross-sectional view of a main portion of a communication IC module.

Next, there will be described a communication integrated circuit (IC) module which is fabricated through the method for fabricating a component built-in multilayer substrate according to the second embodiment. FIG. 8 is a cross-sectional view of a main portion of a communication IC module 20.

A plurality of thermoplastic resin sheets 111a to 111 g are laminated to form a resin multilayer substrate 51. An RFIC chip 52 is embedded in the resin multilayer substrate 51. The RFIC chip 52 is placed in the area sandwiched by a metal pattern 13.

Further, in the resin multilayer substrate 51, there are formed wirings and circuits constituted by conductor patterns 15 and via conductors 16. Terminal electrodes 29 in the RFIC chip 52 are electrically connected to the conductor patterns 15 through the via conductors 16. On the upper surface of the resin multilayer substrate 51, there is formed a conductor pattern, and a secure IC 32 is mounted thereon. On the lower surface (the mounting surface) of the resin multilayer substrate 51, there are formed terminal electrodes.

The communication IC module 20 is used as a short-distance radio communication module for NFC and the like, for example. The communication IC module 20 can be incorporated in a mount substrate 27 in a unit in which it is incorporated, thereby forming a radio communication device.

Further, the component incorporated in the resin multilayer substrate 51 may be either an active component such as an IC chip or a passive component such as a chip-type ceramic capacitor.

Third Embodiment

Figure 9A:
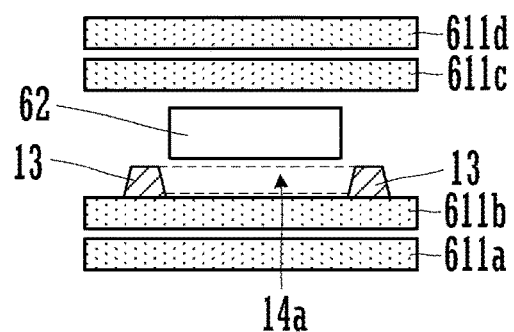
FIGS. 9A to 9C are cross-sectional views illustrating a method for fabricating a component built-in multilayer substrate according to a third embodiment.
Figure 9B:
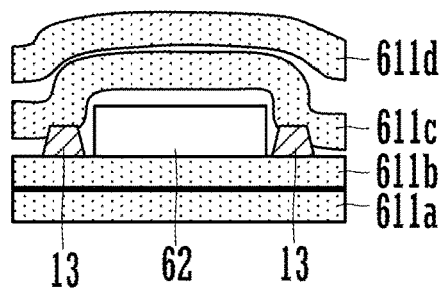
Figure 9C:
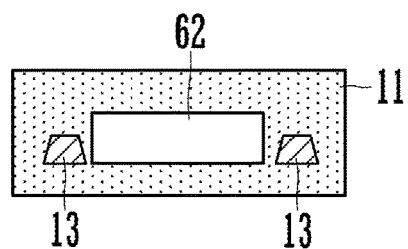

There will be described a method for fabricating a component built-in multilayer substrate according to a third embodiment of the present disclosure. FIGS. 9A to 9C are cross-sectional views illustrating the method for fabricating a component built-in multilayer substrate according to the third embodiment. At first, as illustrated in FIG. 9A, thermoplastic resin sheets 611a to 611d provided with no opening portions are prepared. Further, a metal pattern 13 is formed on a first main surface of the thermoplastic resin sheet 611b.

Next, as illustrated in FIG. 9A and FIG. 9B, thermoplastic resin sheets 611c and 611d are placed on a first main surface of the thermoplastic resin sheet 611b. Further, a thermoplastic resin sheet 611a is placed on a second main surface (opposite from the first main surface) of the thermoplastic resin sheet 611b. Further, the thermoplastic resin sheets 611a to 611d are laminated. At this time, a component 62 having a substantially rectangular flat-plate shape has been inserted in an opening portion 14a in the metal pattern 13. Namely, the component 62 is placed such that the component 62 is sandwiched between the thermoplastic resin sheet 611b and the thermoplastic resin sheet 611c. The component 62 has a thickness which is substantially equal to the thicknesses of the thermoplastic resin sheets 611a to 611d, for example.

Next, as illustrated in FIG. 9C, the thermoplastic resin sheets 611a to 611d are thermally crimped to each other. Thus, the thermoplastic resin sheets 611a to 611d are bonded to each other to be integrated, thereby forming a resin multilayer substrate 11. At this time, the resins forming the thermoplastic resin sheets 611a to 611d are softened and flowed, thereby filling the gap around the component 62 with the resins.

Through the aforementioned processes, the fabrication of the component built-in multilayer substrate incorporating the component 62 has been completed. Further, the other points of the third embodiment are the same as those of the first embodiment.

In the third embodiment, the component 62 has a smaller thickness, and the thickness thereof is substantially equal to the thicknesses of the thermoplastic resin sheets 611a to 611d. Further, the thermoplastic resin sheets 611a to 611d have flexibility. Therefore, even when the thermoplastic resin sheets 611a to 611d are laminated with the component 62 interposed therebetween, there is formed only a smaller gap around the component 62. As a result thereof, it is possible to fill the gap around the component 62 with the thermoplastic resins, during the thermal crimping. Namely, it is possible to fabricate the component built-in multilayer substrate, even without providing opening portions in the thermoplastic resin sheets 611a to 611d.

Further, it is possible to place the component 62 with excellent accuracy at a predetermined position, as in the first embodiment. Further, during the thermal crimping, the thermoplastic resins sandwiched between the side surface of the metal pattern 13 and the side surface of the component 62 are restrained at this position and, therefore, are less prone to be deformed. This can inhibit the position of the component 62 from being deviated from the predetermined position due to flow of the thermoplastic resins.

Other Embodiments

In other embodiments, metal patterns illustrated in FIGS. 10A to 10E can be also used. FIGS. 10A to 10E are plan views illustrating the metal patterns according to the other embodiments. In these embodiments, the other points than the shapes of the metal patterns are the same as those in the first embodiment.

Figure 10A:
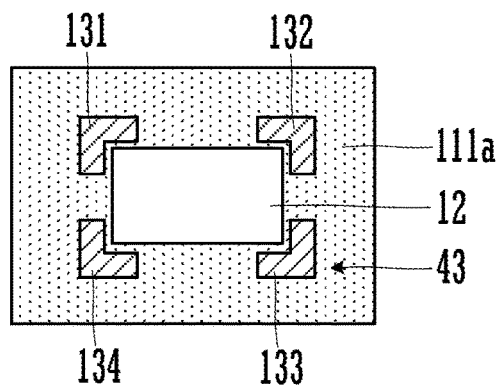
FIGS. 10A to 10E are plan views illustrating metal patterns according to another embodiment.
Figure 10B:
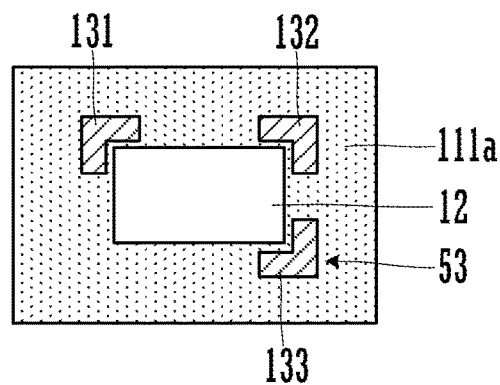

FIG. 10A illustrates a metal pattern 43 having a shape provided by removing the portions corresponding to the four sides from the metal pattern 13 having the frame shape illustrated in FIG. 2. Namely, the metal pattern 43 is constituted by metal patterns 131 to 134 which correspond to the four corners of the metal pattern 13. FIG. 10B illustrates a metal pattern 53 constituted by metal patterns 131 to 133.

Figure 10C:
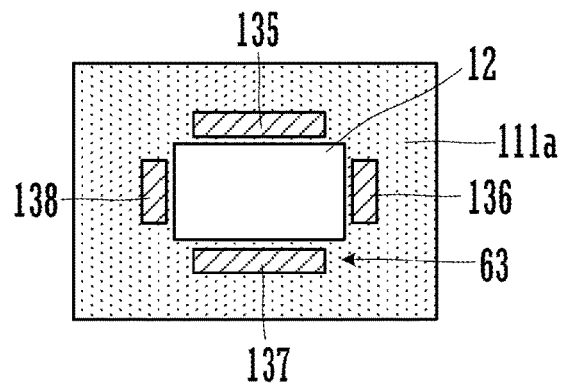
Figure 10D:
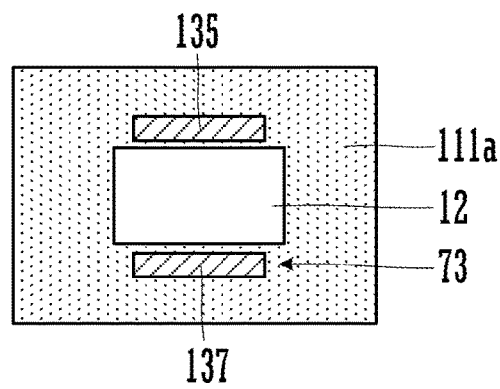

FIG. 10C illustrates a metal pattern 63 having a shape provided by removing the portions corresponding to the four corners from the metal pattern 13. Namely, the metal pattern 63 is constituted by metal patterns 135 to 138 which correspond to the four sides of the metal pattern 13. FIG. 10D illustrates a metal pattern 73 constituted by metal patterns 135 and 137 opposed to each other.

Figure 10E:
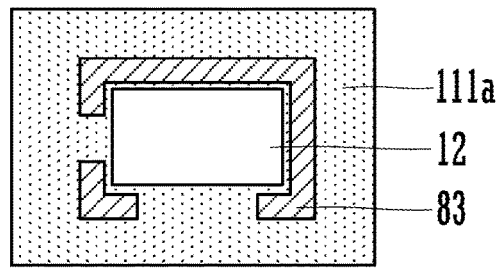

FIG. 10E illustrates a metal pattern 83 having a shape provided by removing the portions corresponding to two sides orthogonal to each other, from the metal pattern 13.

In these embodiments, the component 12 is placed in the area sandwiched by the metal pattern 43, 53, 63, 73 or 83. Therefore, it is possible to place the position of the component 12 with excellent accuracy at a predetermined position, as in the first embodiment.

Further, in the respective embodiments, if the guide pattern (the metal pattern) is tapered in its side surface closer to the component, the guide pattern may not be tapered in its side surface opposite thereto.

REFERENCE SIGNS LIST

10 Antenna module
11, 51 Resin multilayer substrate
12, 62 Component
13, 43, 53, 63, 73, 83, 131 to 138 Metal pattern (Guide pattern)
14a, 14b, 14c Opening portion
15 Conductor pattern
16 Via conductor
20 Communication IC module
21, 22 Stripe-shaped portion
23 Solder resist
24, 25, 26 Mounted component
27 Mounting substrate
29 Terminal electrode
31 Conductive paste
33a, 33b Opening surface
34 Cavity
35 Predetermined position
42 Ferrite core
52 RFIC chip
111a Thermoplastic resin sheet (first thermoplastic resin sheet)
111b, 111c Thermoplastic resin sheet (second thermoplastic resin sheet)
111a to 111h, 611a to 611d Thermoplastic resin sheet

What is claimed is:

1. A component built-in multilayer substrate fabricating method for incorporating a component in a resin multilayer substrate formed by laminating and pressing thermoplastic resin sheets so as to crimp them to each other, the method comprising the steps of:

providing a guide pattern on a component mounting surface of a first thermoplastic resin sheet which constitutes the thermoplastic resin sheets;

inserting the component in an area sandwiched by the guide pattern; and bringing a second thermoplastic resin sheet constituting the thermoplastic resin sheets into contact with the component mounting surface;

wherein, out of widths relating the area sandwiched by the guide pattern, a width in the component mounting surface side is assumed to be a width $W_2$, and a width in the component insertion side is assumed to be a width $W_3$, the width $W_2$ being equal to or larger than a width $W_1$ of the component but less than the width $W_3$, the second thermoplastic resin sheet is provided with an opening portion formed in a main surface of the second thermoplastic resin sheet, the component is positioned in the opening portion when viewed in a direction normal to the component mounting surface, the opening portion has a width $W_4$ which is equal to or larger than the width $W_3$, an end of the second thermoplastic resin sheet defines a side of the opening portion, and the end of the second thermoplastic resin sheet overlaps an upper portion of the guide pattern farthest from the component mounting surface along a direction perpendicular to the main surface of the second thermoplastic resin sheet, and when the thermoplastic resin sheets are laminated and crimped to each other, the component is connected to a via conductor, and a layer different from a layer including the guide pattern includes the via conductor.

2. The component built-in multilayer substrate fabricating method according to claim 1, wherein
assuming that the component has a largest width of a width $W_5$ when the component is inclined with respect to the component mounting surface, the width $W_2$ is equal to or less than the width $W_5$.

3. The component built-in multilayer substrate fabricating method according to claim 1, wherein the guide pattern comprises a metal pattern.

4. The component built-in multilayer substrate fabricating method according to claim 2, wherein the guide pattern comprises a metal pattern.

5. The component built-in multilayer substrate fabricating method according to claim 1, wherein the component is a radio frequency integrated circuit.

6. The component built-in multilayer substrate fabricating method according to claim 1, wherein the component is a ferrite core.

* * * * *